(12) United States Patent
Byeon

(10) Patent No.: US 7,646,652 B2
(45) Date of Patent: Jan. 12, 2010

(54) INTERNAL VOLTAGE GENERATOR FOR USE IN SEMICONDUCTOR MEMORY DEVICE

(75) Inventor: Sang-Jin Byeon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 165 days.

(21) Appl. No.: 11/647,401

(22) Filed: Dec. 29, 2006

(65) Prior Publication Data

US 2007/0280008 A1 Dec. 6, 2007

(30) Foreign Application Priority Data

May 31, 2006 (KR) .................. 10-2006-0049123

(51) Int. Cl.
*G11C 5/14* (2006.01)
(52) U.S. Cl. .................. 365/189.09; 365/189.08; 365/189.11
(58) Field of Classification Search ............ 365/189.98, 365/189.08, 189.11
See application file for complete search history.

(56) References Cited

U.S. PATENT DOCUMENTS

| 5,452,896 A | | 9/1995 | Core | |
|---|---|---|---|---|
| 5,862,096 A | * | 1/1999 | Yasuda et al. ............... | 365/229 |
| 5,892,390 A | * | 4/1999 | Tobita ......................... | 327/543 |
| 5,901,102 A | * | 5/1999 | Furutani ...................... | 365/226 |
| 2005/0017704 A1 | * | 1/2005 | Mo et al. ..................... | 323/313 |
| 2005/0225379 A1 | * | 10/2005 | Im et al. ...................... | 327/540 |
| 2005/0231269 A1 | | 10/2005 | Kim et al. | |
| 2006/0091938 A1 | | 5/2006 | Kim | |
| 2006/0179378 A1 | * | 8/2006 | Iida et al. ..................... | 714/733 |
| 2006/0221743 A1 | * | 10/2006 | Jeong .......................... | 365/222 |
| 2006/0232302 A1 | * | 10/2006 | Lee et al. ..................... | 327/1 |

FOREIGN PATENT DOCUMENTS

| JP | 2000-077534 | 3/2000 |
|---|---|---|
| KR | 1994-0022558 | 10/1994 |
| KR | 10-2002-0076073 A | 10/2002 |
| KR | 10-2003-0084145 A | 11/2003 |
| KR | 10-2006-0040504 A | 5/2006 |

OTHER PUBLICATIONS

Korean Office Action issued in corresponding Korean Patent Application No. KR 10-2006-0049123, dated on Jan. 23, 2008.

* cited by examiner

*Primary Examiner*—Thong Q Le
(74) *Attorney, Agent, or Firm*—IP & T Law Firm PLC

(57) ABSTRACT

An internal voltage generator stably supplies an internal voltage in a semiconductor device. The internal voltage generator includes: a first internal voltage generating means for supplying a first internal voltage which has a level corresponding to a first reference voltage using an external voltage; a second internal voltage generating means for supplying a second internal voltage which has a level corresponding to a second reference voltage using the external voltage; and a third internal voltage generating means for supplying a third internal voltage which has a level corresponding to a third reference voltage generated based on the first internal voltage, using the second internal voltage as a power source.

18 Claims, 6 Drawing Sheets

US 7,646,652 B2

1

INTERNAL VOLTAGE GENERATOR FOR USE IN SEMICONDUCTOR MEMORY DEVICE

CROSS-REFERENCE TO RELATED APPLICATION

The present invention claims priority of Korean patent application number 10-2006-0049123, filed on May 31, 2006, which is incorporated by reference in its entirety.

BACKGROUND OF THE INVENTION

The present invention relates to semiconductor design technology; and, more particularly, to an internal voltage generating apparatus to stably supply an internal voltage to a semiconductor device.

Generally, in order to maintain a stable voltage level of an internal power, an internal power supply senses a voltage drop of an internal voltage and improves the drivability of the internal voltage when the internal voltage is lower than a reference voltage corresponding to a desired internal voltage.

FIG. 1 is a block diagram of a conventional internal power supply. Referring to FIG. 1, the conventional internal power supply includes a VCORE voltage generating unit 10, a VCP voltage generating unit 20 and a VBLP voltage generating unit 30. The VCORE voltage generating unit 10 supplies a normal voltage VCORE, which has a voltage level corresponding to a normal-reference voltage VREFC, using an external voltage VDD. The VCP voltage generating unit 20 receiving the normal voltage VCORE produces an internal voltage VCP which is a half (½) of the normal voltage VCORE. The VBLP voltage generating unit 30 receiving the normal voltage VCORE produces an internal voltage VBLP which is a half (½) of the normal voltage VCORE.

The internal voltage VCP is a voltage which is applied to a plate of a capacitor in a unit cell of a memory to store data. That is, the internal voltage VCP is a voltage which is applied to a reference terminal. The internal voltage VCP, which is a half (½) of the normal voltage VCORE in the voltage level, is used for securing the reliability of data stored in the unit cell, being applied to both ends of the capacitor regardless of a logic level of data stored in the unit cell. Also, the internal voltage VBLP is a voltage which is applied to bit lines in order to precharge the bit lines through which the data are transferred from the unit cell. The normal voltage VCORE is called "internal core voltage" and is used in a core region to store the data. In FIG. 1, the VCP voltage generating unit 20 and the VBLP voltage generating unit 30 have the same circuit implementation, but each of the voltage signals produced by the VCP voltage generating unit 20 and the VBLP voltage generating unit 30 is used in different regions. Therefore, an internal circuit design of only the VCP voltage generating unit 20 will be illustrated below.

FIG. 2 is a circuit diagram of a VCP generating unit according to the conventional internal power supply of FIG. 1 and the reference numeral 20A denotes the VCP voltage generating unit in FIG. 1. Referring to FIG. 2, the VCP voltage generating unit 20A includes a driving control unit 21 for producing a pull-down control signal CNT_PD and a pull-up control signal CNT_PU in response to the level of the normal voltage VCORE and a driving unit 22 for driving the internal voltage VCP, which is half (½) of the normal voltage VCORE in the voltage level, in response to the pull-down control signal CNT_PD and the pull-up control signal CNT_PU. The driving control unit 21 includes resistors PM1 and NM2, diodes NM1 and PM2. The resistor PM1 is implemented by a PMOS transistor which is connected between the supply ter-

2 minal of the normal voltage VCORE and a first output node N1 and has a gate to which a ground voltage VSS is applied. The diode NM1 is implemented by an NMOS transistor which is connected to one end of the first output node N1 and the diode PM2 implemented by a PMOS transistor which is connected between one end of the diode NM1 and a second output node N2. The resistor NM2 is implemented by an NMOS transistor which is connected between the second output node N2 and a ground voltage VSS terminal.

The driving unit 22 includes an NMOS transistor NM3, which has a source-drain path between the supply terminal of the normal voltage VCORE and the supply terminal of the internal voltage VCP and which has a gate to receive the pull-up control signal CNT_PU, and a PMOS transistor PM3, which has a drain-source path between the supply terminal of the internal voltage VCP and the supply terminal of the ground voltage VSS and which has a gate to receive the pull-down control signal CNT_PD. The driving control unit 21 divides the normal voltage VCORE and then outputs the pull-up control signal CNT_PU and the pull-down control signal CNT_PD. The driving unit 22 produces the internal voltage VCP in response to the pull-up control signal CNT_PU and the pull-down control signal CNT_PD.

If the level of the internal voltage VCP decreases, the pull-down current through the PMOS transistor PM3 also decreases, whereas the NMOS transistor NM3 supplies much more current. Since the voltage level at the drain of the NMOS transistor NM3 decreases, the NMOS transistor NM3 is relatively and strongly turned on. However, since the voltage level at the source of the PMOS transistor PM3 is decreased, the PMOS transistor PM3 is lightly activated.

On the other hand, the driving unit 22 in FIG. 2 operates in a source follow manner because all the source terminals of the NMOS transistor NM3 and the PMOS transistor PM3 are connected to the supply terminal of the internal voltage VCP. However, the source follow has a disadvantage in its drivability.

FIG. 3 is a circuit diagram of a VCP generating unit according to another conventional internal power supply and the reference numeral 20B denotes the VCP voltage generating unit in FIG. 1. Referring to FIG. 3, the VCP voltage generating unit 20B a includes a reference voltage generating unit 23, a control unit 24 and a driving unit 25. The reference voltage generating unit 23 receives the normal voltage VCORE and produces a reference voltage REF, which is a target voltage of the internal voltage VCP. The control unit 24 produces a pull-up driving signal PDRV and a pull-down driving signal NDRV in order to make the internal voltage VCP maintained in a voltage level corresponding to the reference voltage REF. The driving unit 25 drives the internal voltage VCP in response to the pull-up driving signal PDRV and the pull-down driving signal NDRV.

The control unit 24 includes first and second bias control units 24a and 24b, a gate control unit 24c and a signal generator 24d. The first bias control unit 24a, to which the reference voltage REF is applied, produces a first bias control signal NBIAS so that a fixed current flows toward the supply terminal of the ground voltage VSS. The second bias control unit 24b, to which the reference voltage REF is applied, produces a second bias control signal PBIAS so that a fixed current flows from the supply terminal of the normal voltage VCORE. The gate control unit 24c, in response to the first and second bias control signals NBIAS and PBIAS, maintains a fixed bias current and then outputs first and second gate control signals NGATE and PGATE which is lower or higher than the reference voltage REF by a threshold voltage of the PMOS transistor and the NMOS transistor, respectively. The signal generator 24d, in response to the first and second bias control signals NBIAS and PBIAS, maintains the fixed bias current and then produces a pull-down driving signal NDRV and a pull-up driving signal PDRV by sensing the level of the internal voltage VCP based on the first and second gate control signals NGATE and PGATE.

The driving unit 25 includes a PMOS transistor PM4 having a source-drain path between the supply terminal of the normal voltage VCORE and the supply terminal of the internal voltage VCP and having a gate to which the pull-up driving signal PDRV is applied, and an NMOS transistor NM4 having a drain-source path between the supply terminal of the internal voltage VCP and the supply terminal of the ground voltage VSS and having a gate to which the pull-down driving signal NDRV is applied.

The reference voltage generating unit 23 includes PMOS transistors PM5 and PM6 and resistors R1 and R2. The PMOS transistor PM5 has a source connected to the normal voltage VCORE and a gate and a drain which are connected to each other. The resistor R1 is connected to both the drain of the PMOS transistor PM5 and an output node N3 and the resistor R2 is connected to the output node N3. The PMOS transistor PM6 has a source connected to the resistor R2 and a gate and a drain which are connected to each other. A voltage applied to the output node N3 is output as the reference voltage REF.

As shown in FIG. 3, the normal voltage VCORE and the ground voltage VSS, as driving power supply voltages, are applied to the reference voltage generating unit 23, the control unit 24 and the driving unit 25.

FIG. 4 is a circuit diagram of a VCP generating unit according to further another conventional internal power supply and the reference numeral 20C denotes the VCP voltage generating unit in FIG. 1. Referring to FIG. 4, the VCP voltage generating unit 20C includes a reference voltage generating unit 26, a control unit 27, a driving signal generating unit 28 and a driving unit 29. The reference voltage generating unit 26 receives the normal voltage VCORE and produces a reference voltage REF which is a target voltage of the internal voltage VCP. The control unit 27 produces a pull-up control signal CNT_PU and a pull-down control signal CNT_PD in order to maintain the internal voltage VCP at a voltage level corresponding to the reference voltage REF. The driving signal generating unit 28 outputs a pull-up driving signal PDRV and a pull-down driving signal NDRV by amplifying a voltage difference between the pull-up control signal CNT_PU and the pull-down control signal CNT_PD based on the reference voltage REF. The driving unit 29 drives the internal voltage VCP in response to the pull-up driving signal PDRV and the pull-down driving signal NDRV.

As compared with the VCP generating unit in FIG. 3, the VCP generating unit in FIG. 4 further includes the driving signal generating unit 28. The driving signal generator 28 includes a first differential amplifier DA1 receiving a differential input signal between the reference voltage REF and the pull-up control signal CNT_PU to output the pull-up driving signal PDRV and a second differential amplifier DA2 receiving a differential input signal between the reference voltage REF and the pull-down control signal CNT_PD to output the pull-down driving signal NDRV.

As mentioned above, the drivability can be improved by outputting the pull-up driving signal PDRV and the pull-down driving signal NDRV through the driving signal which is created by the differential amplifiers. The normal voltage VCORE and the ground voltage VSS, as driving power supply voltages, are applied to the reference voltage generating unit 26, the control unit 27 and the driving signal generating unit 28.

The internal voltage supply, as described above, uses the normal voltage VCORE supplied from one driving power source, produces the reference voltage REF and a plurality of the control signals CNT_PU, CNT_PD, PDRV and NDRV, and supplies VBLP and VCP as the internal voltages.

Therefore, in the conventional internal voltage supply, the normal voltage VCORE, which is used for a driving voltage, has an unstable level and the internal voltages VCP and VBLP are also unstable due to the unstable level of the internal voltages VCP and VBLP. Furthermore, since the internal voltages VCP and VBLP are related to the logic level of data, there can be a failure to discriminate a logic level of the data.

SUMMARY OF THE INVENTION

Embodiments of the present invention are directed to provide an apparatus for stably generating an internal voltage.

In accordance with an aspect of the present invention, there is provided an apparatus for generating an internal voltage including: a first internal voltage generating unit for supplying a first internal voltage which has a level corresponding to a first reference voltage using an external voltage; a second internal voltage generating unit for supplying a second internal voltage which has a level corresponding to a second reference voltage using the external voltage; and a third internal voltage generating unit for supplying a third internal voltage which has a level corresponding to a third reference voltage generated based on the first internal voltage, using the second internal voltage as a power source.

In accordance with another aspect of the present invention, there is provided an apparatus for generating an internal voltage including: a driving control unit for producing a pull-up control signal and a pull-down control signal according to a level of a first internal voltage; and a driving unit for driving a third internal voltage which is half of a second internal voltage in response to the pull-up control signal and the pull-down control signal.

In accordance with a further another aspect of the present invention, there is provided an apparatus for generating an internal voltage including: a reference voltage generating unit for receiving a first internal voltage as a driving power source and for producing a reference voltage which is a target value of a second internal voltage; a control unit for receiving the first internal voltage as a driving power source and for producing a pull-up driving signal and a pull-down driving signal in order that the second internal voltage is maintained in a voltage level corresponding to the reference voltage; and a driving unit for receiving a third internal voltage and for driving the second internal voltage in response to the pull-up driving signal and the pull-down driving signal, wherein the first and third internal voltages are applied from a different power supply source, respectively.

In accordance with still further aspect of the present invention, there is provided an apparatus for generating an internal voltage including: a reference voltage generating unit for receiving a first internal voltage as a driving power source and for producing a reference voltage which is a target value of a second internal voltage; a control unit for receiving the first internal voltage as a driving power source and for producing a pull-up control signal and a pull-down control in order that the second internal voltage is maintained in a voltage level corresponding to the reference voltage; a driving signal generating unit for receiving the first internal voltage as a power supply source and for producing a pull-up driving signal and a pull-down driving signal by amplifying a voltage difference between the pull-up control signal and the reference voltage REF and the pull-down control signal and the reference voltage REF; and a driving unit for receiving the third internal voltage as a power supply source and for driving the second internal voltage in response to the pull-up driving signal and the pull-down driving signal, wherein the first and third internal voltages are applied from a different power supply source, respectively.

In accordance with still further aspect of the present invention, there is provided an apparatus for generating an internal voltage including: a first internal voltage generating unit for supplying a first internal voltage used in a chip as an operating voltage; a second internal voltage generating unit for supplying a second internal voltage based on a reference voltage; and a third internal voltage generating unit having an output unit for supplying a third internal voltage using the first internal voltage as a power supply source and an output control unit for driving the output unit using second internal voltage as a power supply source.

DESCRIPTION OF SPECIFIC EMBODIMENTS

According to the present invention, an internal voltage is maintained in a stable voltage level even if a normal voltage is unstable, because the internal voltage used to control an amount of the drivability stably is used to control another internal voltage.

Embodiments of the present invention will be described with reference to the accompanying drawings.

Figure 1:
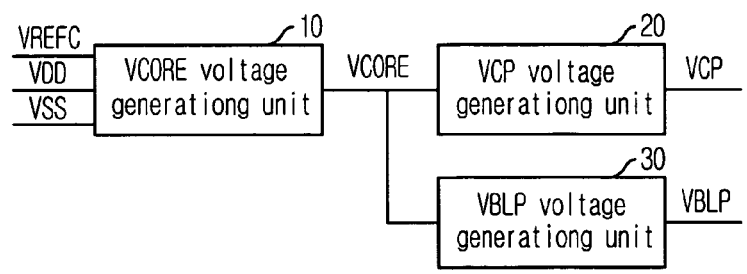
FIG. 1 is a block diagram of a conventional internal power supply.
Figure 2:
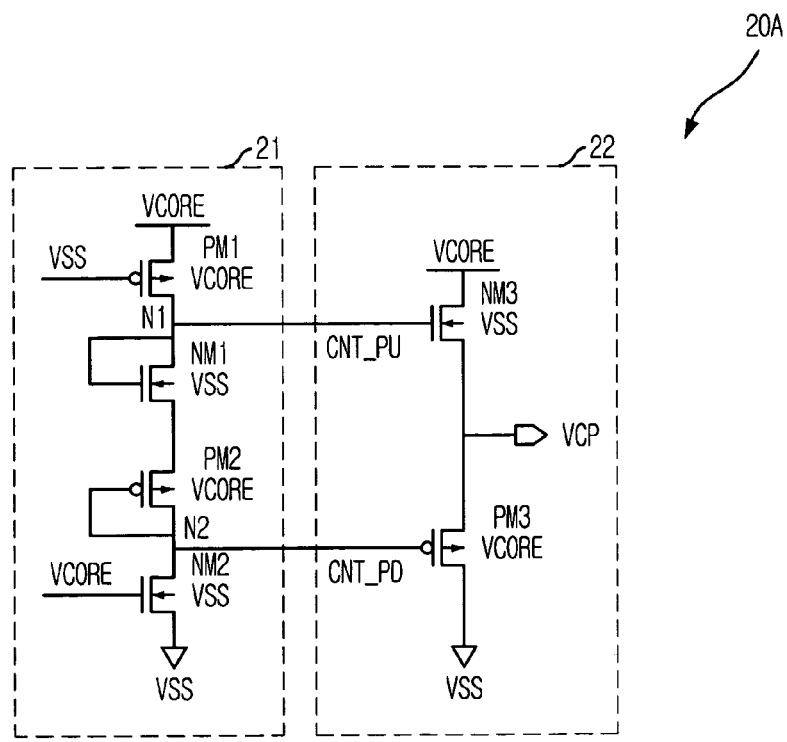
FIG. 2 is a circuit diagram of a VCP generating unit according to the conventional internal power supply of FIG. 1.
Figure 3:
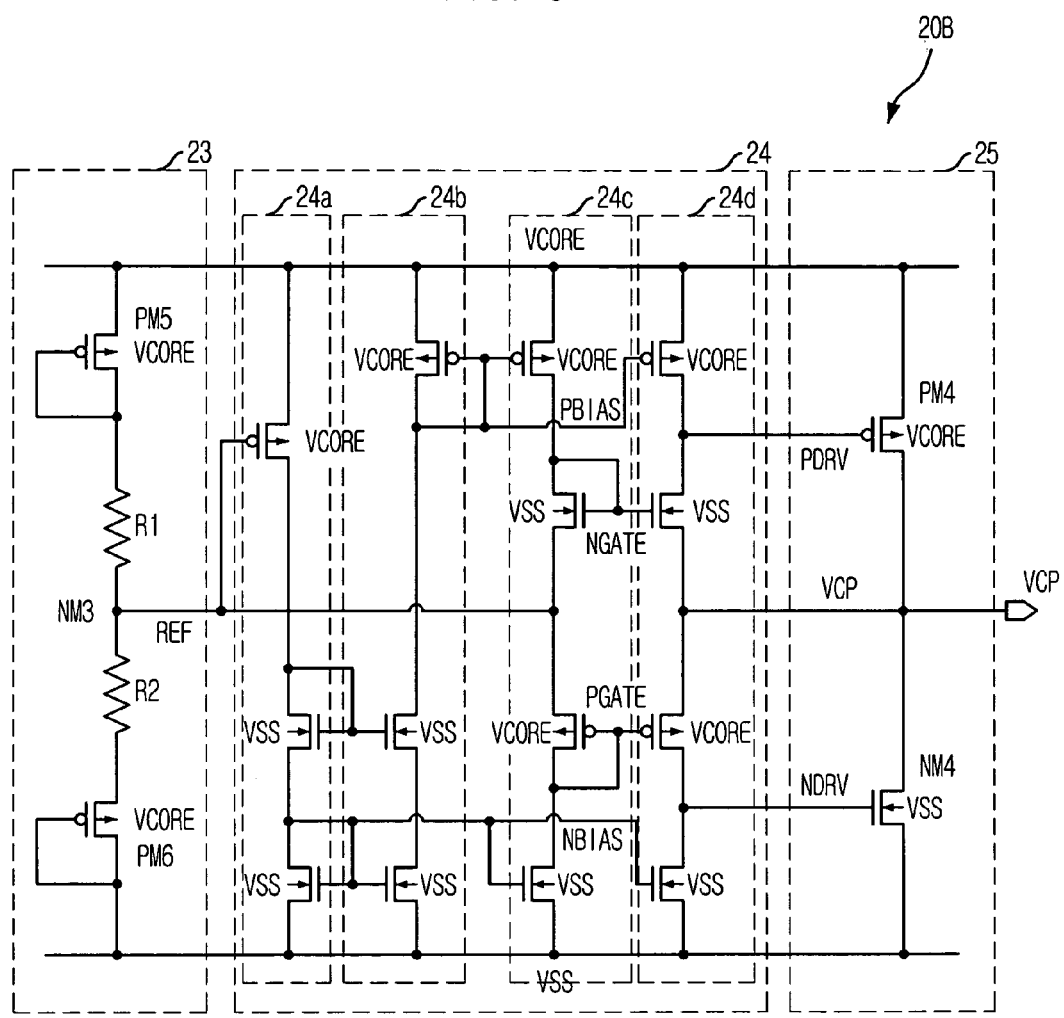
FIG. 3 is a circuit diagram of a VCP generating unit according to another conventional internal power supply.
Figure 4:
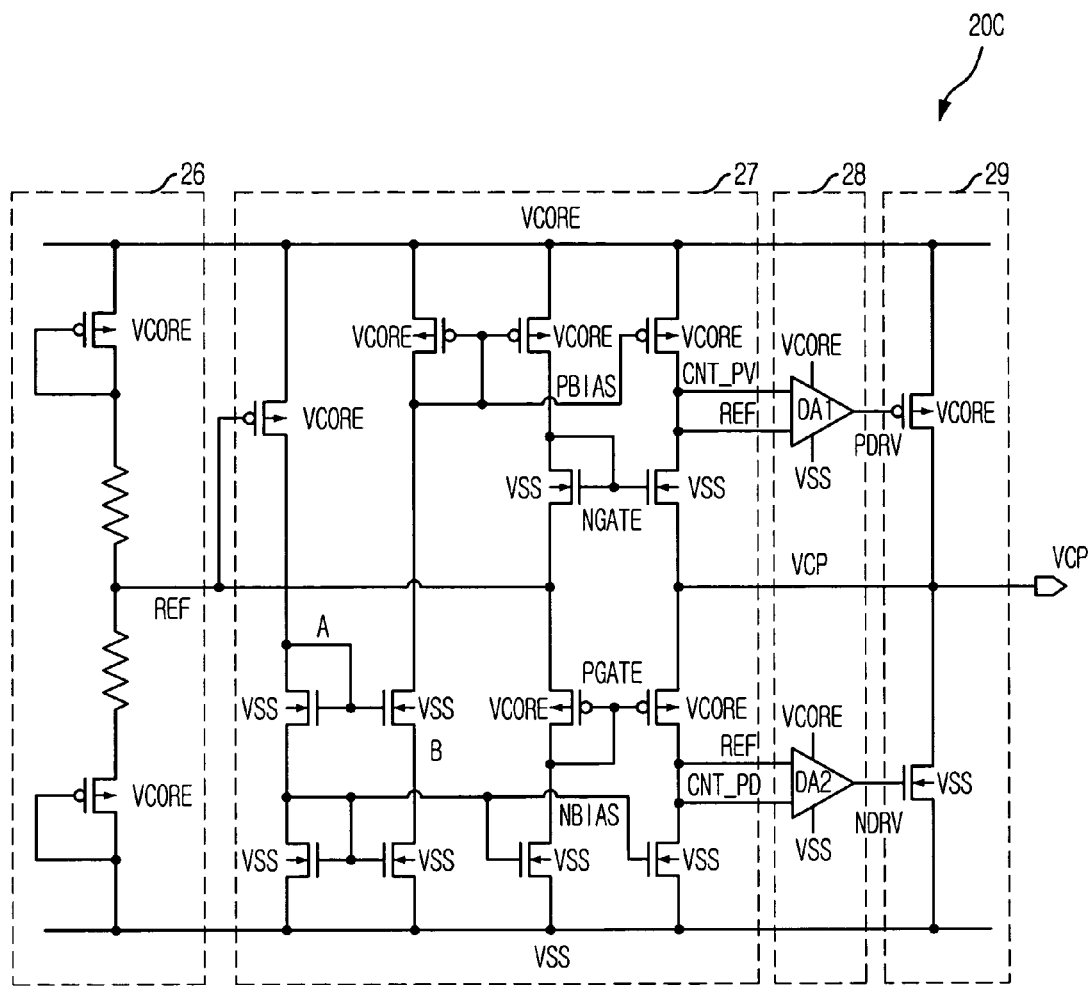
FIG. 4 is a circuit diagram of a VCP generating unit according to further another conventional internal power supply.
Figure 5:
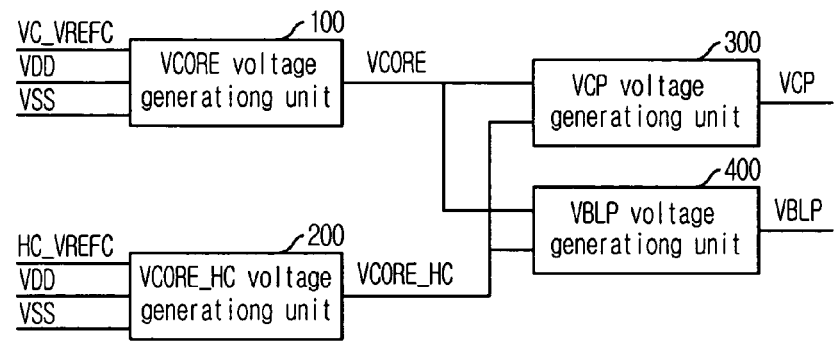
FIG. 5 is a block diagram of an internal power supply according to the present invention.

FIG. 5 is a block diagram of an internal power supply according to the present invention. Referring to FIG. 5, the internal power supply according to the present invention includes a VCORE voltage generating unit 100, a VCORE_HC voltage generating unit 200, a VCP voltage generating unit 300 and a VBLP voltage generating unit 400. The VCORE voltage generating unit 100 supplies a normal voltage VCORE, which has a voltage level corresponding to a normal-core reference voltage VC_VREFC, using an external voltage VDD. The VCORE_HC voltage generating unit 200 supplies an internal voltage VCORE_HG which has a voltage level corresponding to a normal-reference voltage HC_VREFC, using the external voltage VDD. The VCP voltage generating unit 300 receiving the normal voltage VCORE and the internal voltage VCORE_HG produces an internal voltage VCP which is half (½) of the normal voltage VCORE. The VBLP voltage generating unit 400 receiving the normal voltage VCORE and the internal voltage VCORE_HC produces an internal voltage VBLP which is half (½) of the normal voltage VCORE.

For reference, the internal voltage VCORE_HC has the same voltage level as the normal voltage VCORE. The internal voltage VCORE_HC is used as a reference voltage or a driving voltage when the internal voltage which has a voltage level different from the external voltage VDD is created through a down-converting operation, while the normal voltage VCORE is mainly used in the core region.

The internal voltages VCP and VBLP have the same voltage level which is half of the normal voltage VCORE, but they are used in different regions of a semiconductor memory device, respectively. Therefore, the VBLP voltage generating unit 400 has the same configuration as the VCP voltage generating unit 300.

When the internal voltage supply according to the present invention produces the internal voltages VCP and VBLP, which are respectively used for a cell plate and a bit line precharge, not only the normal voltage VCORE but also the internal voltage VCORE_HC are used. That is, since the internal voltages are applied from different voltage sources as a driving power source, the internal voltages VCP and VBLP are stably provided even though the level of the normal voltage VCORE is unstable.

The circuit implementation of the VCP voltage generating unit will be described in detail. Since the VCP voltage generating unit 300 and the VBLP voltage generating unit 400 have the same circuit configuration, only the VCP voltage generating unit 300 will be described.

Figure 6:
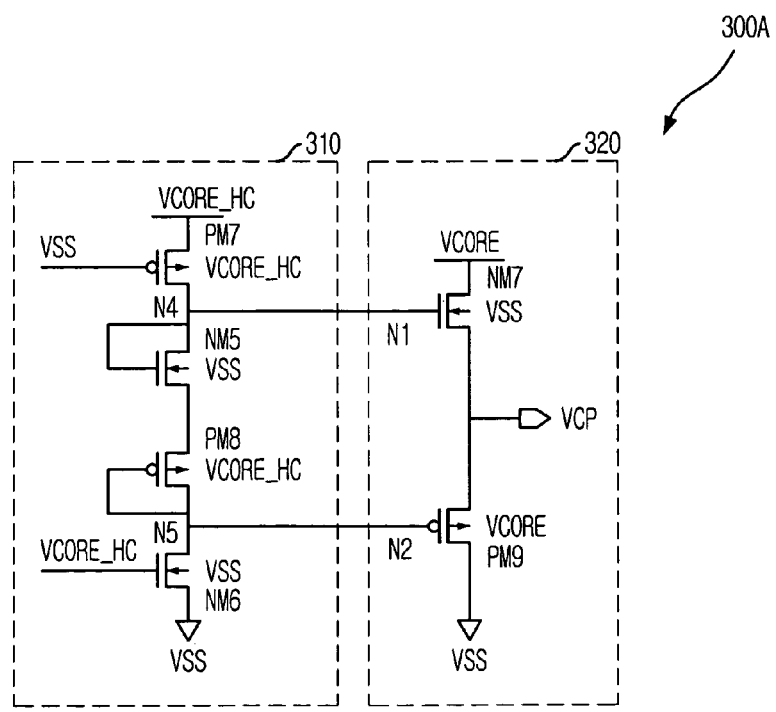
FIG. 6 is a circuit diagram of a VCP generating unit according to a first embodiment of the present invention.

FIG. 6 is a circuit diagram of a VCP generating unit according to a first embodiment of the present invention and the reference numeral 300A denotes the VCP voltage generating unit in FIG. 5. Referring to FIG. 6, the VCP generating unit 300A according to the first embodiment of the present invention includes a driving control unit 310 for producing a pull-up control signal CNT_PU and a pull-down control signal CNT_PD based on the level of the internal voltage VCORE_HC and a driving unit 320 for driving the internal voltage VCP, which is half of the normal voltage VCORE, in response to the pull-up control signal CNT_PU and a pull-down control signal CNT_PD. The driving control unit 310 includes first and second active resistors PM7 and NM6 and first and second diodes NM5 and PM8. The first active resistor PM7 is implemented by a PMOS transistor which is connected between the supply terminal of the internal voltage VCORE_HC and a first output node N4 and has a gate to which a ground voltage VSS is applied. The first diode NM5 is implemented by an NMOS transistor which is connected to one end of the first output node N4 and the second diode PM8 is implemented by a PMOS transistor which is connected between one end of the first diode NM5 and a second output node N5. The second active resistor NM6 is implemented by an NMOS transistor which is connected between the second output node N4 and the supply terminal of the ground voltage VSS.

A voltage signal applied to the first output node N4 is output as the pull-up control signal CNT_PU and a voltage signal applied to the second output node N5 is output as the pull-down control signal CNT_PD. The internal voltage VCORE_HC, as a substrate bias voltage, is applied to both the first active resistor PM5 of the PMOS transistor and the second diode PM8 and the internal voltage VCORE_HC is also applied to a gate of the NMOS transistor to form the second active resistor NM6.

The driving unit 320 includes an NMOS transistor NM7, which has a source-drain path between the supply terminal of the normal voltage VCORE and the supply terminal of the internal voltage VCP and has a gate to which the pull-up control signal CNT_PU is applied, and a PMOS transistor PM9, which has a source-drain path between the supply terminal of the internal voltage VCP and the supply terminal of the ground voltage VSS and has a gate to which the pull-down control signal CNT_PD is applied. The ground voltage VSS, as a substrate bias voltage, is applied to the NMOS transistor NM7 and the normal voltage VCORE, as a substrate bias voltage, is applied to the PMOS transistor PM9. The driving control unit 310 outputs the pull-up control signal CNT_PU and the pull-down control signal CNT_PD by dividing the internal voltage VCORE_HC. Subsequently, the driving unit 320 supplies the internal voltage VCP in response to the pull-down control signal CNT_PD and the pull-up control signal CNT_PU.

When the level of the internal voltage VCP decreases, the pull-down current through the PMOS transistor PM9 also decreases, whereas the NMOS transistor NM7 supplies increasing current. In other words, the decrease of the level of the internal voltage VCP corresponds to a decrease of the voltage level on the source of the NMOS transistor NM7. Accordingly, even if the voltage applied to the gate is constant, the NMOS transistor NM7 is more strongly turned on with a large amount of current due to the decrease of the source voltage. This makes the voltage level at the source of the PMOS transistor NM9 decrease and this decrease of the source voltage causes increase of the gate voltage. Therefore, the PMOS transistor PM9 is less activated and an amount of the supplied current is reduced.

As described above, although the level of the normal voltage VCORE is unstable, the VCP voltage generating unit according to the first embodiment of the present invention maintains a stable voltage level because the pull-down driving signal NDRV and the pull-up driving signal PDRV are created by the internal voltage VCORE_HC. Accordingly, even if the normal voltage VCORE, which is a driving power source of the driving unit 320, is unstable, the internal voltage VCP is stably produced because it is controlled by the stable pull-down and pull-up driving signals NDRV and PDRV.

Therefore, the VCP voltage generating unit 300 uses the internal voltage VCORE_HC and the ground voltage VSS as a driving power source of the driving control unit 310 and also uses the normal voltage VCORE and the ground voltage VSS as a driving power source of the driving unit 320. Since the driving source of the driving control unit 310 is different from that of the driving unit 320, the VCP voltage generating unit 300 is not significantly influenced by the unstable normal voltage VCORE.

Figure 7:
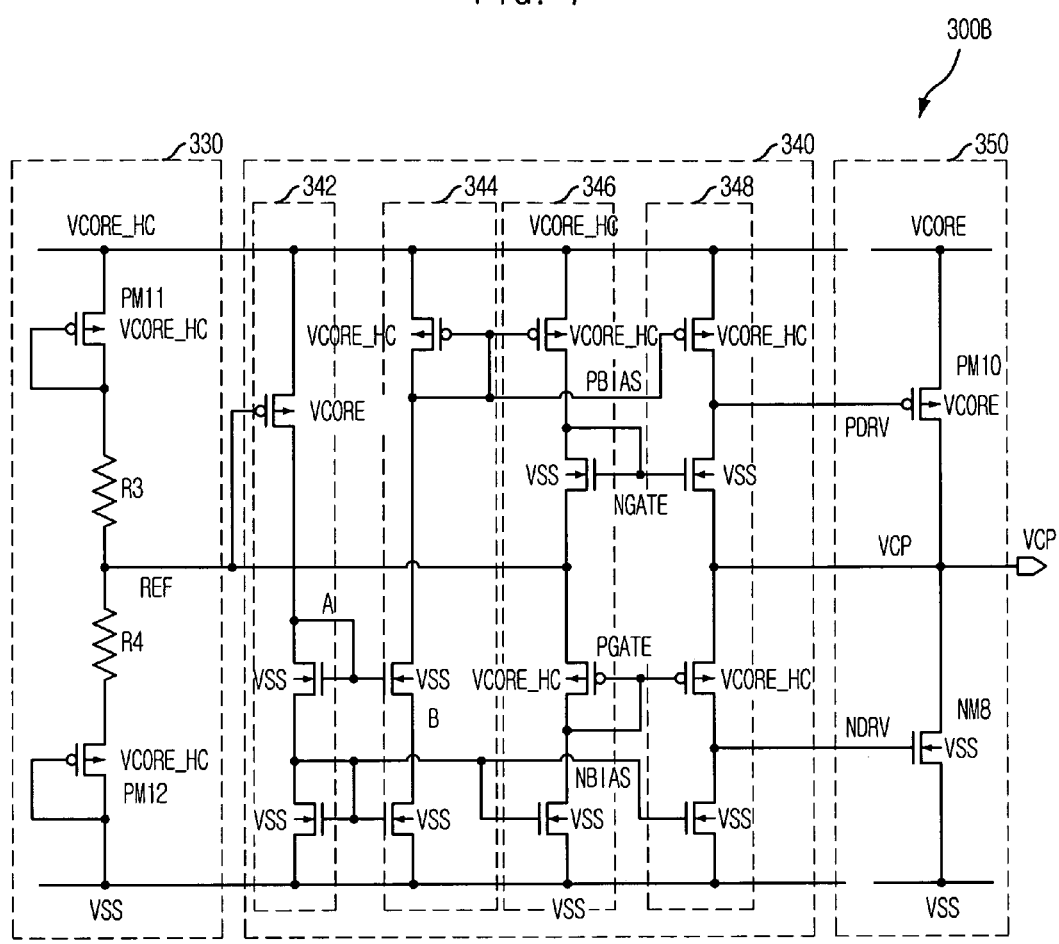
FIG. 7 is a circuit diagram of a VCP generating unit according to a second embodiment of the present invention.

FIG. 7 is a circuit diagram of the VCP generating unit according to the second embodiment of the present invention and the reference numeral 300B denotes the VCP voltage generating unit in FIG. 5. Referring to FIG. 7, the VCP generating unit 300B according to the second embodiment of the present invention includes a reference voltage generating unit 330, a control unit 340 and a driving unit 350. The reference voltage generating unit 330 receives the internal voltage VCORE_HC and produces a reference voltage REF which is a target voltage of the internal voltage VCP. The control unit 340 produces pull-down and pull-up driving signals NDRV and PDRV in order to make the internal voltage VCP maintained in a level of a corresponding reference voltage REF. The driving unit 350 drives the internal voltage VCP in response to the pull-up driving signal PDRV and the pull-down driving signal NDRV.

The control unit 340 includes first and second bias control unit 342 and 344, a gate control unit 346 and a signal generating unit 348. The first bias control unit 342 receives the reference voltage REF and produces a first bias control signal NBIAS in order that a constant current flows to the supply terminal of the ground voltage VSS. The second bias control unit 344 receives the reference voltage REF and produces a second bias control signal PBIAS in order that a constant current flows from the supply terminal of the internal voltage VCORE_HC. The gate control unit 346, in response to first and second bias control signals NBIAS and PBIAS, maintains a constant bias current and produces first and second gate control signals NGATE and PGATE which are respectively higher or lower than the reference voltage REF by the threshold voltage of the NMOS and PMOS transistors. The signal generating unit 348, in response to first and second bias control signals NBIAS and PBIAS, maintains a constant bias current, senses a level of the internal voltage VCP based on the first and second gate control signals NGATE and PGATE, and produces the pull-down driving signal NDRV and the pull-up driving signal PDRV.

The driving unit 350 includes a PMOS transistor PM10 receiving the pull-up driving signal PDRV through a gate and having a source-drain path between the supply terminal of the normal voltage VCORE and the supply terminal of the internal voltage VCP, and an NMOS transistor NM8 receiving the pull-down driving signal NDRV through a gate and having a drain-source path between the supply terminal of the internal voltage VCP and the supply terminal of the ground voltage VSS.

The reference voltage generating unit 330 includes a PMOS transistor PM11, which receives the normal voltage VCORE through a source and has a gate and a drain which are connected to each other, a resistor R3 which is connected between the drain of the PMOS transistor PM11, an output node, a resistor R4 having one end which is connected to the output node, and a PMOS transistor PM12 having a source connected to the other end of the resistor R4 and having a gate and a drain which are connected to the supply terminal of the ground voltage VSS. The reference voltage generating unit 330 outputs a voltage signal on the output node as the reference voltage REF.

On the other hand, as shown in FIG. 7, the reference voltage generating unit 330 and the control unit 340 receive the internal voltage VCORE_HC and the ground voltage VSS as the driving power source and the normal voltage VCORE and the ground voltage VSS, as the driving power, are applied to the driving unit 350.

As mentioned above, the driving power source of both the reference voltage generating unit 330 and the control unit 340 which produces the pull-up driving signal PDRV and the pull-down driving signal NDRV for controlling the driving unit 350 is different from that of the driving unit 350. Therefore, even though the level of the normal voltage VCORE is unstable, the driving unit 350 can produce the stable internal voltage VCP in response to the pull-down driving signal NDRV and the pull-up driving signal PDRV which is created by the stable internal voltage VCORE_HC.

Figure 8:
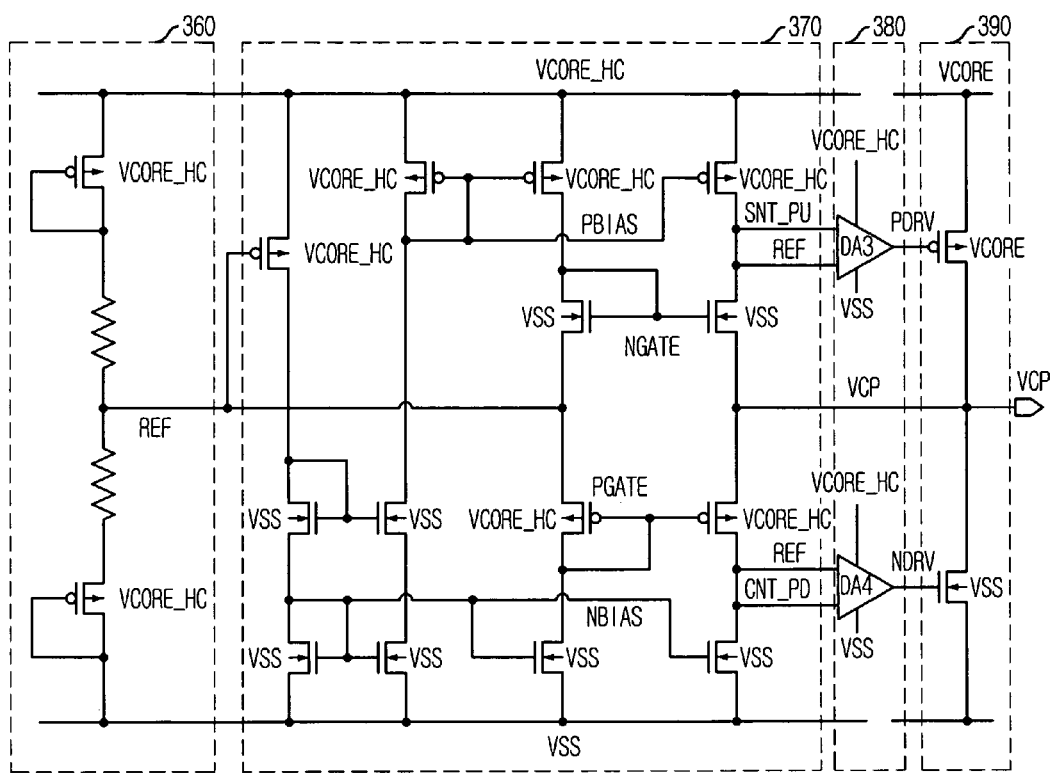
FIG. 8 is a circuit diagram of a VCP generating unit according to a third embodiment of the present invention.

FIG. 8 is a circuit diagram of the VCP generating unit according to a third embodiment of the present invention and the reference numeral 300 denotes the VCP voltage generating unit in FIG. 5. Referring to FIG. 8, the VCP generating unit 300C according to the second embodiment of the present invention includes a reference voltage generating unit 360, a control unit 370, a driving signal generating unit 380 and a driving unit 390. The reference voltage generating unit 360 receives the normal voltage VCORE and produces a half-potential reference voltage REF which is a target voltage of the internal voltage VCP. The control unit 370 produces pull-down and pull-up driving signals NDRV and PDRV in order to maintain the internal voltage VCP in a level of a corresponding half-potential reference voltage REF. The driving signal generating unit 380 amplifies a voltage difference between the pull-up control signal CNT_PU and the reference voltage REF and between the pull-down control signal CNT_PD and the reference voltage REF and produces a pull-up driving signal PDRV and a pull-down driving signal NDRV. The driving unit 390 drives the internal voltage VCP in response to the pull-up driving signal PDRV and the pull-down driving signal NDRV.

As compared with the VCP generating unit in FIG. 7, the VCP generating unit in FIG. 8 has the same configuration except for the driving signal generating unit 380. Accordingly, the driving signal generating unit 380 is only illustrated below.

The driving signal generating unit 380 includes a first amplifier DA3, which receives the reference voltage REF and the pull-up control signal CNT_PU as two differential inputs and outputs the pull-up driving signal PDRV, and a second amplifier DA4, which receives the reference voltage REF and the pull-down control signal CNT_PD as two differential inputs and outputs the pull-down driving signal NDRV. The drivability may be improved by applying the pull-down control signal CNT_PD and the pull-up driving signal PDRV through the driving signal generating unit 380.

On the other hand, in the VCP generating according to the third embodiment of the present invention, the reference voltage generating unit 360, the control unit 370 and the driving signal generating unit 380 also receives the internal voltage VCORE_HC and the ground voltage VSS as a driving power source and the driving unit 390 receives the normal voltage VCORE and the ground voltage VSS as a driving power source. Therefore, even though the level of the normal voltage VCORE which is a power source of the normal voltage VCORE is unstable, the pull-down control signal CNT_PD and the pull-up driving signal PDRV are produced by the stable internal voltage VCPORE_HC and the driving unit 390 is driven by the pull-down control signal CNT_PD and the pull-up driving signal PDRV. As a result, it is possible to supply the stable internal voltage VCP.

Therefore, the VCP voltage generating unit according to the first to third preferred embodiments uses the internal voltage VCORE_HC as the driving power source to control an amount of the supply voltage and uses the normal voltage VCORE as the driving power source to control an amount of the supply voltage of the internal voltage VCP. Therefore, even if the level of the normal voltage becomes unstable, the internal voltage VCORE_HC, which is used to control the amount of the drivability, stably controls the internal voltage VCP. The normal voltage VCORE has no effect on the VCP voltage generating unit. In other words, since the driving power source is caused by a different power supply, the internal voltage VCP is maintained in a stable voltage level even if the normal voltage is unstable.

Moreover, the sensing margin can be increased by supplying the stable internal voltage VCP and VBLP. For storing data in a cell, a voltage which is higher or lower than the internal voltage VCP is applied so that the capacitor in the cell is charged by the voltage difference between the applied voltage and the internal voltage VCP. Thereafter, if the bit line sense amplifier is activated for a read or write operation and the amplification operation starts, the charges stored in the cell are transferred to the bit line, which is precharged to the internal voltage VBLP so that the charge sharing operation occurs. At this time, if the internal voltages VCP and VBLP operate with the normal voltage and the normal voltage fluctuates, the internal voltages VCP and VBLP are also unstable and the sensing margin is reduced due to the small voltage difference when the logic low level data is sensed. However, in the present invention, even if the normal voltage is unstable, a sufficient voltage difference for the logic high level data or the logic low level data can be achieved at the time of the charge sharing with the increase of the sensing margin because the stable internal voltages VCP and VBLP are supplied.

In the above-described present invention, the internal voltages VCP and VBLP which are half of the normal voltage are described; however, other voltage levels are also applicable to the semiconductor circuits to compare two potential levels and to output a comparison signal.

While the present invention has been described with respect to the specific embodiments, it will be apparent to those skilled in the art that various changes and modifications may be made without departing from the spirit and scope of the invention as defined in the following claims.

What is claimed is:

1. An apparatus for generating an internal voltage comprising:
a first internal voltage generating unit configured to supply a first internal voltage which has a level corresponding to a first reference voltage using an external voltage;
a second internal voltage generating unit configured to supply a second internal voltage which has a level corresponding to a second reference voltage using the external voltage; and
a third internal voltage generating unit configured to supply a third internal voltage which has a level corresponding to a third reference voltage generated based on the first internal voltage, using the second internal voltage as a power source,
wherein the second internal voltage is used as a reference voltage or a driving voltage of the third internal voltage generating unit when the third internal voltage having a different voltage level from the first internal voltage is produced by down-converting an external voltage.

2. The apparatus in accordance with claim 1, wherein the first internal voltage is a normal voltage used in a core region to store data in a semiconductor memory device and wherein the third internal voltage is a capacitor plate voltage to store the data and a bit line precharge voltage to transfer the data.

3. The apparatus of claim 1, wherein the third internal voltage generating unit includes:
a driving control unit configured to produce a pull-up control signal and a pull-down control signal in response to a level of the first internal voltage; and
a driving unit configured to drive the third internal voltage which is the half of the second internal voltage in response to the pull-up control signal and the pull-down control signal.

4. An apparatus for generating an internal voltage comprising:
a driving control unit configured to produce a pull-up control signal and a pull-down control signal in response to a level of a first internal voltage; and
a driving unit configured to drive a third internal voltage which is a half of a second internal voltage in response to the pull-up control signal and the pull-down control signal,
wherein the second internal voltage is a reference voltage or a driving voltage when an internal voltage having a different voltage level is produced by down-converting an external voltage.

5. The apparatus in accordance with claim 4, wherein the first internal voltage is a core voltage used in a core region, and wherein the third internal voltage is a bit line precharge voltage to transfer data and a capacitor plate voltage to store the data.

6. The apparatus in accordance with claim 4, wherein the driving control unit includes:
   a first active resistor connected between a supply terminal of the first internal voltage and a first output node, having a gate to which a ground voltage is applied;
   a first diode connected to one end of the first output node;
   a second diode connected between one end of the first diode and a second output node; and
   a second active resistor connected between the second output node and a supply terminal of the ground voltage, wherein a voltage applied to the first output node is output as the pull-up control signal and a voltage applied to the second output node is output as the pull-down control signal.

7. The apparatus in accordance with claim 6, wherein the driving unit includes:
   a first NMOS transistor having a source-drain path between a supply terminal of the second internal voltage and a supply voltage of the third internal voltage and having a gate to receive the pull-up control signal; and
   a first PMOS transistor having a drain-source path between a supply terminal of the third internal voltage and the supply voltage of the ground voltage and having a gate to receive the pull-down control signal, wherein the ground voltage is applied to the first NMOS transistor as a substrate voltage and wherein the normal voltage is applied to the second PMOS transistor as a substrate voltage.

8. An apparatus for generating an internal voltage comprising:
   a reference voltage generating unit configured to receive a first internal voltage as a driving power source and to produce a reference voltage which is a target value of a second internal voltage;
   a control unit configured to receive the first internal voltage as a driving power source and to produce a pull-up driving signal and a pull-down driving signal in order that the second internal voltage is maintained in a voltage level corresponding to the reference voltage; and
   a driving unit configured to receive a third internal voltage and to drive the second internal voltage in response to the pull-up driving signal and the pull-down driving signal, wherein the first and third internal voltages are applied from a different power supply source, respectively,
   wherein the second internal voltage is a reference voltage or a driving voltage when an internal voltage having a different voltage level is produced by down-converting an external voltage.

9. The apparatus in accordance with claim 8, wherein the control unit includes:
   a first bias control unit configured to receive the reference voltage and to produce a first bias control signal in order that a fixed current flows toward a supply terminal of a ground voltage;
   a second bias control configured to receive the reference voltage and to produce a second bias control signal in order that a fixed current flows from a supply terminal of the first internal voltage;
   a gate control unit, in response to the first and second bias control signals, configured to receive a fixed bias current and to output a first gate control signal which is higher than the reference voltage by a threshold voltage of an NMOS transistor and a second gate control signal which is lower than the reference voltage by a threshold voltage of a PMOS transistor;
   a signal generating unit, in response to the first and second bias control signals, configured to maintain a fixed bias current and to produce the pull-down driving signal and the pull-up driving signal by sensing a level of the second internal voltage based on the first and second gate control signals.

10. The apparatus in accordance with claim 9, wherein the driving unit includes:
    a first NMOS transistor having a source-drain path between a supply terminal of the third voltage and a supply voltage of the second internal voltage and having a gate to receive the pull-up control signal; and
    a first PMOS transistor having a drain-source path between the supply terminal of the second internal voltage and the supply voltage of the ground voltage and having a gate to receive the pull-down control signal.

11. The apparatus in accordance with claim 10, wherein the reference voltage generating unit includes:
    first and second resistors connected in series between the supply terminal of the first internal voltage and an output node; and
    third and fourth resistors connected in series between the output node and the supply terminal of the ground voltage, wherein the reference voltage is output from the output node.

12. An apparatus for generating an internal voltage comprising:
    a reference voltage generating unit configured to receive a first internal voltage as a driving power source and to produce a reference voltage which is a target value of a second internal voltage;
    a control unit configured to receive the first internal voltage as a driving power source and to produce a pull-up control signal and a pull-down control in order that the second internal voltage is maintained in a voltage level corresponding to the reference voltage;
    a driving signal generating unit configured to receive the first internal voltage as a power supply source and to produce a pull-up driving signal and a pull-down driving signal by amplifying a voltage difference between the pull-up control signal and the reference voltage REF and the pull-down control signal and the reference voltage REF; and
    a driving unit configured to receive the third internal voltage as a power supply source and to drive the second internal voltage in response to the pull-up driving signal and the pull-down driving signal, wherein the first and third internal voltages are applied from a different power supply source, respectively,
    wherein the second internal voltage is a reference voltage or a driving voltage when an internal voltage having a different voltage level is produced by down-converting an external voltage.

13. The apparatus in accordance with claim 12, wherein driving signal generating unit includes:
    a first differential amplifier to which the reference voltage and the pull-up control signal are applied for outputting the pull-up driving signal; and
    a second differential amplifier to which the reference voltage and the pull-down control signal are applied for outputting the full-down driving signal.

14. The apparatus in accordance with claim 13, wherein the control unit includes:

a first bias control unit configured to receive the reference voltage and to produce a first bias control signal in order that a fixed current flows toward a supply terminal of a ground voltage;

a second bias control unit configured to receive the reference voltage and to produce a second bias control signal in order that a fixed current flows from a supply terminal of the first internal voltage;

a gate control unit, in response to the first and second bias control signals, configured to maintain a fixed bias current and to output a first gate control signal which is higher than the reference voltage by a threshold voltage of an NMOS transistor and a second gate control signal which is lower than the reference voltage by a threshold voltage of a PMOS transistor;

a signal generating unit, in response to the first and second bias control signals, configured to maintain a fixed bias current and to produce the pull-down driving signal and the pull-up driving signal by sensing a level of the second internal voltage based on the first and second gate control signals.

15. The apparatus in accordance with claim 14, wherein the driving unit includes:

a first NMOS transistor having a source-drain path between a supply terminal of the third voltage and a supply voltage of the second internal voltage and having a gate to receive the pull-up control signal; and a first PMOS transistor having a drain-source path between the supply terminal of the second internal voltage and the supply voltage of the ground voltage and having a gate to receive the pull-down control signal.

16. The apparatus in accordance with claim 15, wherein the reference voltage generating unit includes:

first and second resistors connected in series between the supply terminal of the first internal voltage and an output node; and third and fourth resistors connected in series between the output node and the supply terminal of the ground voltage, wherein the reference voltage is output from the output node.

17. An apparatus for generating an internal voltage comprising:

a first internal voltage generating unit configured to supply a first internal voltage used in a chip as an operating voltage;

a second internal voltage generating unit configured to supply a second internal voltage based on a reference voltage; and a third internal voltage generating unit configured to include an output unit for supplying a third internal voltage using the first internal voltage as a power supply source and an output control unit for driving the output unit using second internal voltage as a power supply source, wherein the second internal voltage is used as a reference voltage or a driving voltage of the third internal voltage generating unit when the third internal voltage having a different voltage level from the first internal voltage is produced by down-converting an external voltage.

18. The apparatus of claim 17, wherein the third internal voltage generating unit includes:

a driving control unit configured to produce a pull-up control signal and a pull-down control signal in response to a level of the first internal voltage; and a driving unit configured to drive the third internal voltage which is a half of the second internal voltage in response to the pull-up control signal and the pull-down control signal.

* * * * *